United States Patent [19]

Linder et al.

[11] Patent Number: 4,618,941
[45] Date of Patent: Oct. 21, 1986

[54] APPARATUS AND METHOD FOR GENERATING FILTERED MULTILEVEL DATA FROM NRZ DATA

[75] Inventors: Donald L. Linder, Palatine; Scott N. Carney, Hoffman Estates, both of Ill.

[73] Assignee: Motorola, Inc., Schaumburg, Ill.

[21] Appl. No.: 533,484

[22] Filed: Sep. 19, 1983

[51] Int. Cl.[4] .................. G06F 7/38; G06G 7/02; H04L 25/34; H04L 25/49
[52] U.S. Cl. .................... 364/724; 364/825; 375/17; 360/41
[58] Field of Search .............. 364/724, 825, 773; 333/165–167; 375/17–19, 103; 360/41

[56] References Cited

U.S. PATENT DOCUMENTS

| 3,737,808 | 8/1973 | Srivastava | 333/20 |
| 3,814,917 | 6/1974 | Nussbaumer | 364/724 |
| 3,883,727 | 5/1975 | Stuart et al. | 235/152 |
| 3,946,214 | 3/1976 | Stuart et al. | 235/152 |
| 3,949,206 | 4/1976 | Edwards et al. | 235/156 |
| 4,092,618 | 5/1978 | Guidaux | 364/724 |
| 4,121,295 | 10/1978 | Witt | 364/724 |
| 4,323,864 | 4/1982 | Ogawa et al. | 333/165 |

OTHER PUBLICATIONS

*Generation of Digital Signalling Waveforms*, by Herbert B. Voelcker, 2/68, pp. 81–93, text on p. 91 under Multi-Level Signalling.
*A Digital Mobile Radio for 5–6 Kilohertz Channels*, by Scott Carney, Donald Linder, dated Jun. 1982, pp. 1–8, & Subtitle "Base-Band Premodulation Filter".

*Primary Examiner*—James D. Thomas
*Assistant Examiner*—Dale M. Shaw
*Attorney, Agent, or Firm*—Charles L. Warren; Edward M. Roney; Donald B. Southard

[57] ABSTRACT

An embodiment of the invention includes a binary linear phase response filter having a plurality of weighted outputs and a summing circuit which sums groups of the weighted outputs. A polarity inverting mechanism is provided for selectively changing the polarity of the summed outputs from the summing circuit means. An encoding circuit controls the polarity selection in accordance with the logic rule for converting non-return to zero (NRZ) data into return to zero data. Another summing circuit sums the outputs of the polarity inverting mechanism and provides a filtered multilevel data output.

22 Claims, 4 Drawing Figures

APPARATUS AND METHOD FOR GENERATING FILTERED MULTILEVEL DATA FROM NRZ DATA

BACKGROUND OF THE INVENTION

This invention relates generally to the filtering of multilevel data and more specifically to the utilization of a finite impulse response (FIR) binary filter in combination with an encoder for encoding non-return to zero (NRZ) into multilevel data. The present invention is particularly, but not exclusively, suited for use as a splatter filter which limits the frequency spectrum of the data before same is applied to modulate a signal in a communications system.

It is known to use a conventional analog filter as a splatter filter to reduce the transmitted spectrum of data. However, an analog filter causes intersymbol interference due to group delay variations, i.e., the non-linear phase response of the filter. This causes energy from one bit to be smeared to the next bit thereby reducing the ability to distinguish between bits. Although Bessel type filters provide a linear phase response, they provide insufficient high frequency attenuation.

A digital filter having a linear phase response such as an FIR filter can be utilized to overcome the intersymbol interference associated with analog filters. A conventional FIR filter comprises a tapped delay line in which each tapped output is weighted prior to being summed together. This method is easily applied to binary NRZ data by using a shift register made of flip-flops for the delay line. However, such an FIR filter cannot be directly used to filter multilevel data since the flip-flops only have a binary output. To directly filter multilevel data having N levels, a multilevel delay line having N states would be required. The complexity associated with such a multilevel delay line makes this approach undesirable.

SUMMARY OF THE INVENTION

It is an object of this invention to provide an improved circuit means for generating return to zero, filtered, multilevel data.

A further object of this invention is to provide an improved method for converting NRZ data into return to zero, filtered, multilevel data.

An exemplary embodiment of the invention includes a binary FIR filter having a plurality of weighted outputs and summing a circuit means which sums groups of the weighted outputs. A polarity inverting means is provided for selectively changing the polarity of the summed outputs from the summing circuit means. An encoding circuit controls the polarity selection in accordance with the logic rule for converting NRZ data into return to zero data. Another summing means sums the outputs of the polarity inverting means nd provides a multilevel data output.

An illustrative method of the present invention includes the steps of filtering NRZ data in an FIR filter. Groups of the weighted outputs of the FIR filter are summed together to define summation outputs. The number of weighted outputs in each group can not exceed the number of samples per bit of NRZ data. The summation outputs are subjected to different amplification gains according to an encoding rule for converting NRZ data to the desired multilevel data. The amplified signals are summed together to provide filtered multilevel data.

BRIEF DESCRIPTION OF THE DRAWINGS

In the embodiments of the present invention as shown in the accompanying drawings, the same reference numbers in the different figures refer to like elements.

DETAILED DESCRIPTION

In order to facilitate an understanding of the present invention an embodiment 10 of an exemplary embodiment of the invention will be described and its operation explained with reference to FIGS. 1-3. A generalized representation of an embodiment of the present invention is shown in FIG. 4 and will be explained with reference to this figure.

Figure 1:
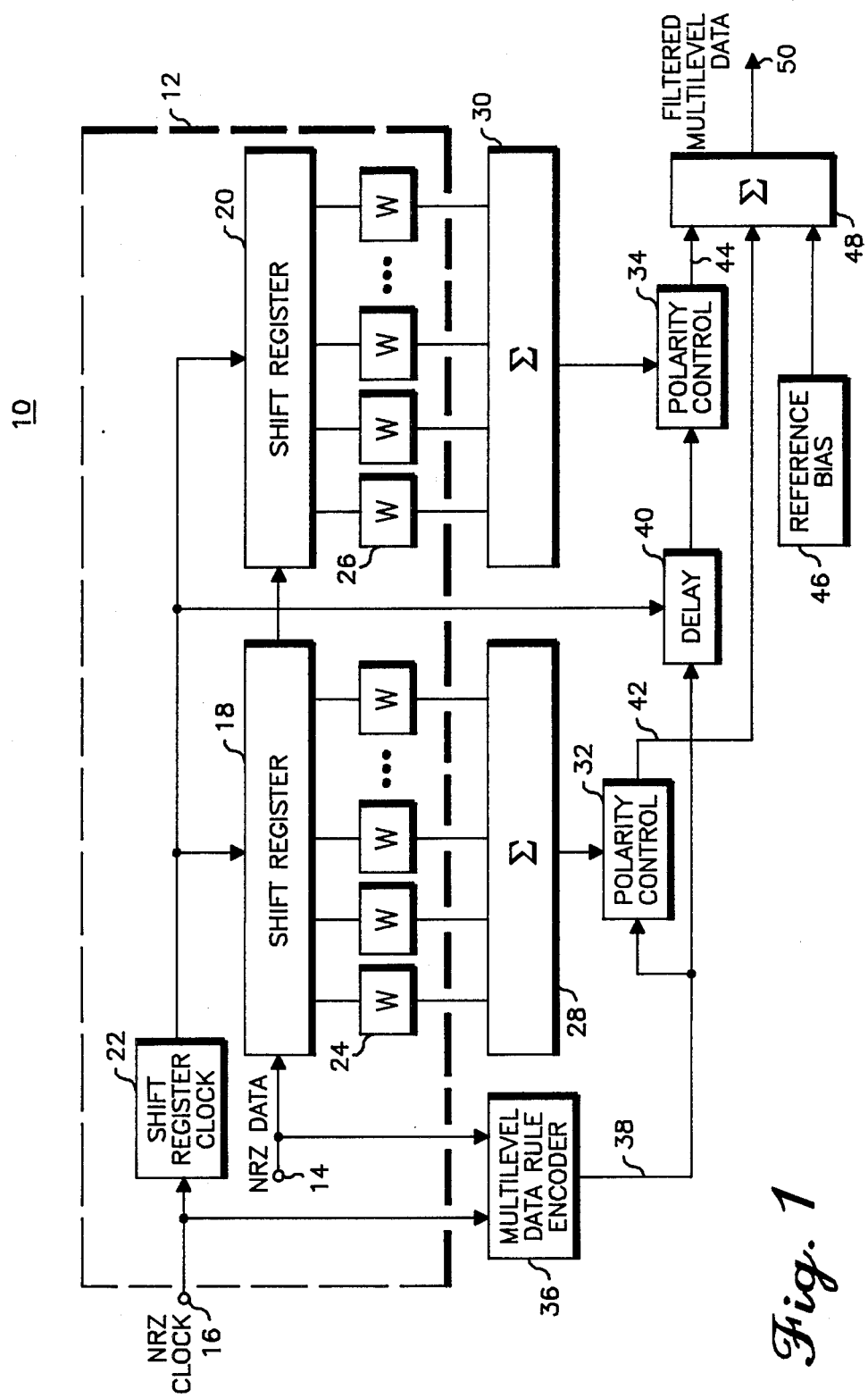
FIG. 1 is a block diagram of an illustrative embodiment of the present invention.

In FIG. 1, embodiment 10 includes a binary FIR filter 12 which receives NRZ data and NRZ clock signals at inputs 14 and 16, respectively. The NRZ data is shifted through shift registers 18 and 20 at a rate determined by the output of shift register clock generator 22. This clock generates a clock output which is M times the NRZ clock rate thereby defining the number of samples per NRZ bit. The binary outputs of the stages of shift registers 18 and 20 are weighted by means of weighting elements 24 and 26 which may consist of resistors having values selected to yield the desired filter characteristic. The outputs of weighting elements 24 and 26 are summed by means of summation circuits 28 and 30, respectively.

The outputs of summation circuits 28 and 30 are coupled to polarity or inversion control circuits 32 and 34 which determine how the summed outputs of a corresponding bit of NRZ data will be mapped. For example, the summed output from circuit 32 could be mapped into a +1 or a −1. A multilevel data rule encoder 36 provides an output signal 38 which selectively controls the level into which the polarity controllers 32 and 34 will map the summed inputs. A delay circuit 40 delays the output 38 before it is coupled to polarity control circuit 34 so that the NRZ sample data contained in shift register 18 when shifted into shift register 20 will be subject to the same polarity control. The outputs 42 and 44 of the polarity control circuits 32 and 34 are summed together, preferably with the output from a reference bias circuit 46, in a summation circuit 48 to provide filtered multilevel output data at output 50.

Figure 2:
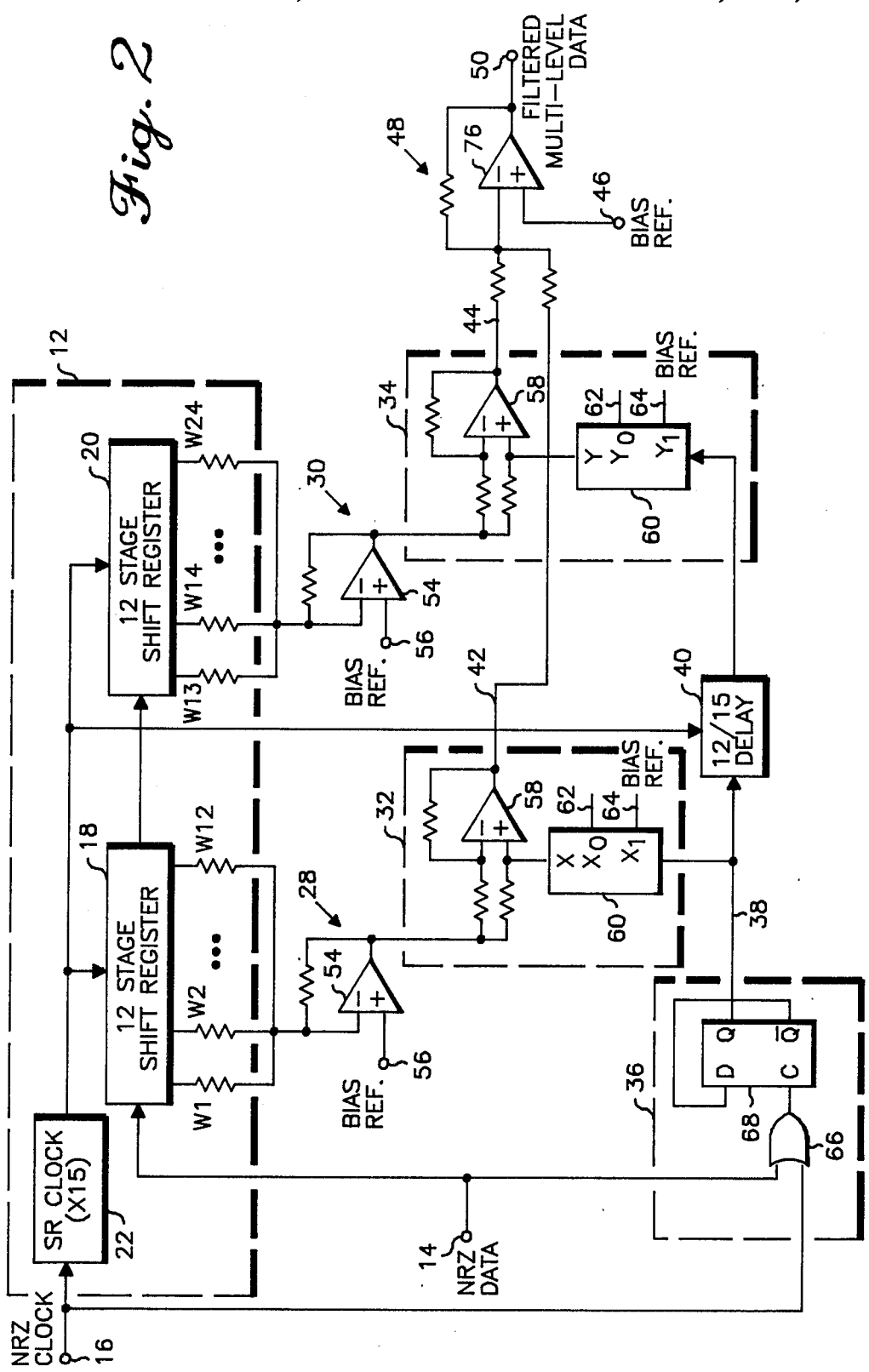
FIG. 2 is a schematic diagram more specifically illustrating the embodiment shown in FIG. 1.

FIG. 2 illustrates a specific example of the present invention generally shown in FIG. 1. The FIR filter 12 includes a clock 22 which generates 15 clock signals for each NRZ clock received at input 16. This defines the number of times each NRZ data bit will be sampled, i.e. the number of samples per bit (NS)=15. Each bit of NRZ data at input 14 is clocked sequentially through the 12 stage shift registers 18 and 20. Weighting resistors W1–W12 and W13–W24 provide weighting for each stage of shift registers 18 and 20, respectively. The values of the weighting resistors are selected to yield the desired filter response characteristic as will be well known to those skilled in the art.

Resistors W1–W12 define a first group and resistors W13–W24 define a second group in which the weighted outputs of the resistors in each group are summed by means of summation circuits 28 and 30. Each such summation circuit may consist of an operational amplifier 54 which sums the resultant output signal from each group of resistors with respect to a predetermined bias reference 56. Preferably the gain or amplification of summing circuits 28 and 30 are equal.

Polarity control circuits 32 and 34 provide selectable gain control for the outputs of summation circuits 28 and 30. The gain of each polarity control circuit is determined by the output 38 from multilevel data encoder 36. In this exemplary embodiment the gain of each circuit is selected to be $+1$ or $-1$ dependent upon the state of output 38. The gain can generally be $+X$ or $-X$, where X is a real number. The plus and minus gain control is utilized to map the sampled outputs corresponding to each NRZ data "1" into a level $+1$ or $-1$ in three level data having levels of $+1$, 0, $-1$. Each polarity control circuit may consist of an operational amplifier 58 which receives as inputs the output of the corresponding summation circuit and the common port of an analog gate 60 controlled by the output 38. Either a first bias reference 62 or a different second bias reference 64 is coupled to amplifier 58 by gate 60. In the illustrative example, gate 60 couples either an open circuit corresponding to bias point 62 or a predetermined bias voltage level 64 to the positive input of operational amplifier 58 causing the latter to selectively function as a polarity inverter and a level shifter wherein coupling bias 64 yields a gain of $-1$ and coupling open circuit 62 yields a gain of $+1$. Preferably, the gain of operational amplifier 58 is selected to be unity so that it functions only as a selectable polarity inverter.

The exemplary multilevel data rule encoder 36 shown in FIG. 2 implements a rule for encoding NRZ data into a type of three level data knwon as duobinary. It consists of an OR gate 66 having inputs coupled to receive the NRZ data and the NRZ clock, and has an output coupled to th clock input of a type D flip-flop 68. The $\overline{Q}$ output of flip-flop 68 is coupled to the D input with the Q output providing a control signal 38.

Figure 3:
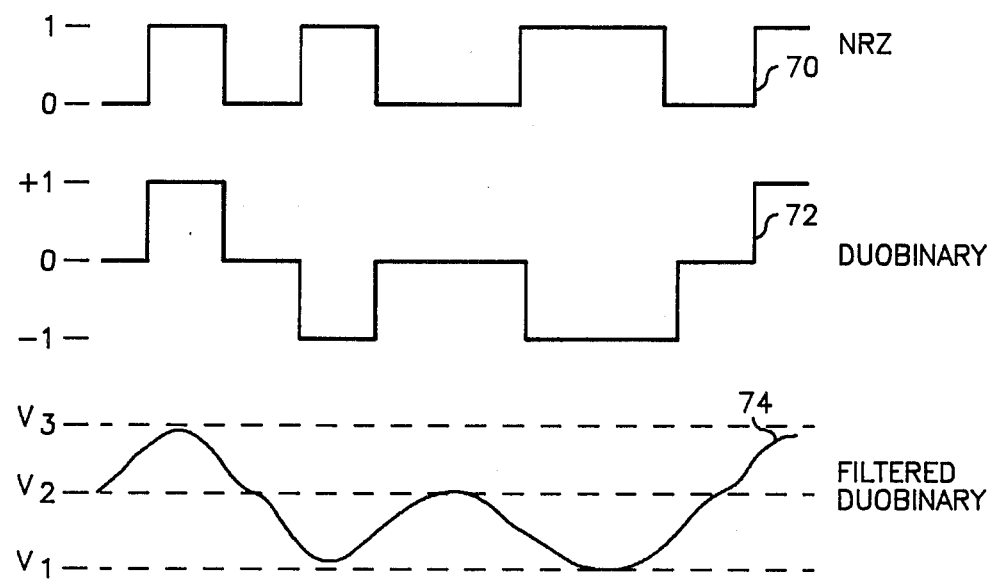
FIG. 3 is a graph illustrating an NRZ waveform, a corresponding multilevel (doubinary) waveform, and a filtered duobinary waveform.
Figure 4:
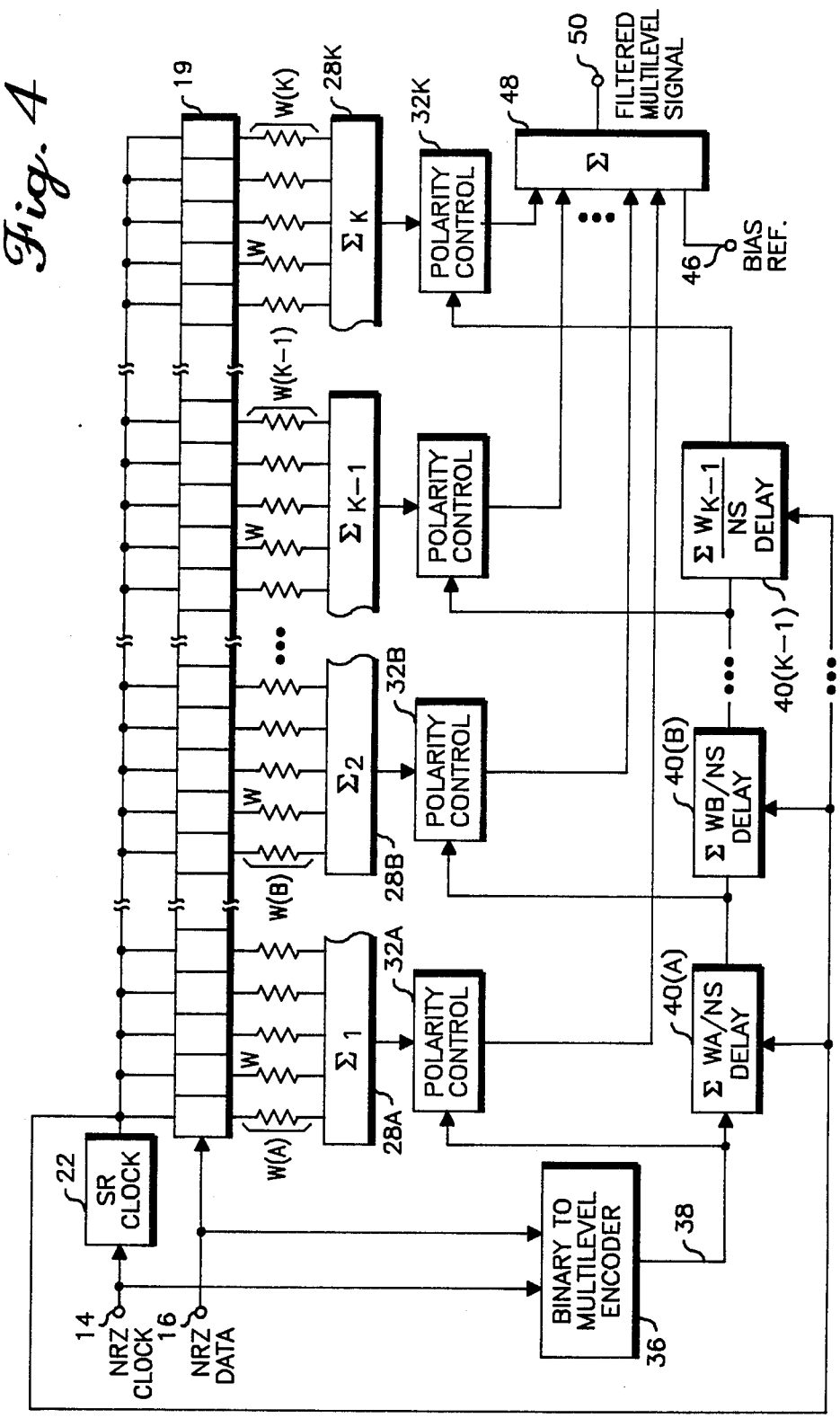
FIG. 4 is a block diagram illustrating a generalized implementation of the present invention.

FIG. 3 shows an illustrative NRZ data waveform 70 which has been encoded into a duobinary wiveform 72. To encode NRZ data into duobinary, the NRZ 0's are always mapped into duobinary 0's, and NRZ 1's are mapped into either a duobinary $+1$ or $-1$. The sign of the next duobinary 1 will remain the same as the sign of the preceding 1 if an even number of 0's separate same, and will reverse when the adjacent 1's of the NRZ data are separated by an odd number of 0's.

In the multilevel encoder 36 as seen in FIG. 2, flip-flop 68 is clocked once at the end of each NRZ 0 enabling output 38 to change state. With respect to an initial state of output 38, this output will change state upon the presence of an odd number of NRZ 0's but will assume the initial state upon an even number of NRZ 0's. The output 38 of encoder 36 causes polarity control circuits 32 and 34 to select the proper polarity for the sampled data corresponding to each NRZ bit such that duobinary encoding is properly implemented.

The output 38 of encoder 36 is delayed by delay circuit 40 prior to controlling polarity control circuit 34. This delay circuit may comprise a conventional variable delay circuit such as an MC14557. The duration of the delay is equal to the number of preceding weighting elements divided by the number of samples per bit (NS). In the illustrative embodiment this delay equals 12/15. This delay is required so that the same polarlity control will be exercised with respect to the sample bits in register 20 as was applied when the same sample bits occupied register 18.

Summation circuit 48 may consist of an operational amplifier 76 which sums the outputs 42 and 44 with equal weighting together with a predetermined bias reference 46. The bias reference 46 determines the voltage reference V2 (see FIG. 3) which corresponds with the duobinary level 0 at output 50. The voltage references V1 and V3 are a function of the gain of summation circuits 28, 30, 48 and of polarity control circuits 32, 34 and the bias references 56, 62, and 64.

From the filtered duobinary waveform 74 in FIG. 3, it will be apparent that a single 1 in duobinary located between 0's does not result in the filtered duobinary waveform reaching a maximum value, either V1 or V3. This occurs because at any given time 1.6 bits of NRZ data is in the delay line (24 total samples $\div$ 15 samples per bit). Therefore, for a 1 disposed between 0's, the delay line will contain 15 samples corresponding to a 1 and 9 samples corresponding to a 0; the total resultant summation of the content of the delay line approaches but not equal the maximum value for a $+1$ or $-1$ unless two consecutive NRZ 1's occur.

An important aspect of this invention resides in the ability to control the polarity of a summed group of weighted outputs as opposed to requiring individual polarity control for each. To attain this advantage the number of weighted outputs per group must not exceed the number of samples per bit (NS). Stated alternatively, a maximum of one equivalent bit of NRZ data can be contained within a group. This insures that each group will be filled with samples corresponding only to a 0 NRZ bit at some time. It is during such a condition that the polarity inversion circuits can be switched without causing an output discontinuity since NRZ 0's are always mapped into the same multilevel state. Thus, this invention provides a simplified and novel means for generating return to zero, multilevel, filtered data from binary NRZ data. In the illustrative example three level data is generated. Three level return to zero data is data having three different states wherein a transition from the highest to lowest or lowest to highest state is not permitted, i.e. an intermediate level corresponding to a "0" must intervene. Examples of such data include duobinary, biternary, and polar return-to-zero. Requiring a 0 to occur between $+1$ and $-1$ transitions insures that the samples within each group will be filled with a 0 prior to the requirement for a change in polarity.

FIG. 4 illustrates a generalized embodiment of the present invention containing a binary delay line 19 comprised of N shift register stages. The binary output of each stage is coupled to a weighting element W which has a weighting value selected to define the desired filter characteristics. Summation circuits 28A–28K each sum a group of weighting networks W(A)–W(K). The number of weighting networks summed by each summation circuit cannot exceed the number of samples per bit defined by SR clock 22.

Polarlity control circuits 32A–32K determine the sign and magnitude of the gain to be applied to the summed outputs from summation circuits 28A–28K, respectively. A binary to multilevel encoder 36 provides an output 38 for controlling the parameters of the polarity control circuits. The encoder contains the necessary logic elements to implement an encoding rule for mapping binary NRZ data into the desired return to zero multilevel data. Delay circuits 40(A)-40(K-1) sequentially delay output 38 before the latter is applied to control polarity control circuits 32B-32K, respectively. The duration of each delay equals the number of weighting elements summed in the preceding group divided by the number of samples per bit (NS). This permits the same polarity control to be applied to a given bit samples as it propagates down delay line 19.

In the method of the present invention for generating filtered, multilevel, return to zero data frm binary NRZ data, each bit of NRZ data is sampled by propagating same through a binary shift register at a clock rate M times the NRZ clock rate. The output of each stage of the shift register is weighted by means of a weighting element having values selected to yield a desired filter characteristic. Summation circuits sum the output signals from groups of the weighting elements wherein the number of weighting elements per group does not exceed M.

The output of each summation circuit is amplified by a variable gain circuit (polarity control circuit) having a selectively controlled gain. A gain controlling signal is generated by a multilevel encoder circuit for controlling the gain of these circuits. The outputs of the gain circuits are summed to provide filtered multilevel data.

The gain control signl is delayed before being applied to variable gain circuits subsequent to the first gain circuit such that the sampled bits for a given NRZ bit will be subjected to the same gain and polarity as it propagates through each group of weighting elements. The total time delay applied with respect to a given gain control circuit associated with a certain group of weighting elements is equal to the total number of weighting elements in all the preceding groups divided by the number of samples per bit of NRZ data (NS). Preferably the outputs of the variable gain circuits are summed with a given bias reference signal which determines a bias reference point for one of the states of the multilevel data.

It will be apparent to those skilled in the art that various modifications and substitutions can be made to the illustrative embodiments, and that alternative equivalents can be utilized without departing from the scope of the present invention which is defined by the following claims.

What is claimed is:

1. An apparatus for generating filtered return to zero multilevel data from binary non-return to zero (NRZ) data comprising:
a binary finite impulse response (FIR) filter including a shift register means having a plurality of stages which receives the NRZ data, clock means for providing clock pulses to said shift register means for sampling each bit of NRZ data, a weighting element coupled to each stage for weighting each stage's output, and means for summing groups of said weighting elements to define summed signals, the number of weighting elements in each group not exceeding the number of clock pulses occurring during each bit of NRZ data;
means for selectively inverting the polarity of each of said summed signals, said inverting means comprising an operational amplifier for each of said summed signals, and means for selectively biasing each operational amplifier to function either as an inverting amplifier or a noninverting amplifier;
means responsive to each NRZ data bit for controlling the polarity selection of said inverting means in accordance with said return to zero multilevel data to be generated; and
means for summing each of said polarity selected summed signals to define said filtered return to zero multilevel data.

2. The apparatus according to claim 1 wherein said operational amplifiers have a predetermined gain of +1 or -1 selected by said biasing means.

3. An apparatus for generating filtered return to zero multilevel data having three or more levels from binary data comprising:
a binary linear phase response filter for filtering the binary data, said filter sampling each bit of binary data and having an output corresponding to each sample;
means for summing groups of said outputs wherein the number of outputs in each group does not exceed the number of times each bit of binary data is sampled by said filter, the output of each summing means defining summed signals;
means for amplifying said summed signals by predetermined amplification factors,;
means responsive to each bit of binary data for controlling the selection of said amplification factor in accordance with the return to zero multilevel data to be generated, said controlling means comprising a logic means for generating a control signal in response to each bit of said binary data that determines the amplification factor to be used;
means for summing each of said amplified summed signals to define said filtered return to zero multilevel data; and
means for time delaying said control signal with respect to a given amplifying means for a time duration equal to the number of preceding outputs coupled to said amplifying means divided by the number of times each bit of binary data is sampled.

4. The apparatus according to claim 3 wherein said linear phase filter comprises a finite impulse response filter.

5. The apparatus according to claim 3 wherein said amplifying means has predetermined amplification factors of +1 and -1.

6. A method for generating filtered return to zero multilevel data from binary data comprising the steps of:
filtering said binary data by means of a filter having a linear phase response;
summing the output signals from the filter in groups wherein the number of outputs in each group does not exceed the sampling rate per bit of binary data, the output of each summed group defining a summed signal;
amplifying the summed signals with predetermined amplification factors;
selecting the amplification factor to be utilized in response to ech bit of binary data in accordance with the return to zero multilevel data to be generated;
permitting the amplification factor to be changed only when all the outputs in a given group being amplified correspond to the same bit of binary data; and summing each of the amplified summed signals to define the filtered return to zero multilevel data.

7. The method according to claim 6 wherein the step of selecting the amplification factor consists of selecting between an amplification factor of +X or −X, wherein X is a real number.

8. The method according to claim 7 wherein X is 1.

9. The method according to claim 6 wherein said step of output signal summing includes summing consecutive outputs so that only consecutive samples of one bit of said binary data are summed together.

10. The method according to claim 6 further comprising the step of shifting consecutive samples of the binary data through said filter.

11. An apparatus for generating filtered return to zero multilevel data from binary non-return to zero (NRZ) data comprising:
 a binary finite impulse response (FIR) filter including a shift register means having a plurality of stages which receives the NRZ data, clock means for providing clock pulses to said shift register means for sampling each bit of NRZ data, a weighting element coupled to each stage for weighting each stage's output, and means for summing groups of said weighting elements to define summed signals, the number of weighting elements in each group not exceeding the number of clock pulses occurring during each bit of NRZ data;
 means for selectively inverting the polarity of each of said summed signals;
 means responsive to each NRZ data bit for controlling the polarity selection of said inverting means in accordance with said return to zero multilevel data to be generated, said controlling means including a logic circuit means for implementing a logic rule for encoding NRZ data into return to zero multilevel data, said logic circuit means controlling the polarlity selection of each of said inverting means such that a change in polarity for any given inverting means can occur only when each of the shift register stages coupled to said given inverting means has the same logic state; and
 means for summing each of said polarity selected summed signals to define said filtered return to zero multilevel data.

12. The apparatus according to claim 11 wherein a change in polarity by said inverting means is permitted only if said logic state is a logic zero.

13. The apparatus according to claim 11 wherein said logic circuit means generates a polarity control signal which is coupled to each of said inverting means, and said controlling means further comprises a means for delaying said control signal with respect to a given inverting means for a time duration equal to the number of shift register stages preceding the shift register stages coupled to said given inverting means divided by the number of clock pulses occurring during each bit of NRZ data.

14. The apparatus according to claim 11 wherein said group summing means sums a group of consecutive weighting elements such that only consecutive samples of NRZ data are summed together.

15. The apparatus according to claim 11 wherein each group of said weighting elements summed by said summing means corresponds to samples of one bit of NRZ data.

16. The apparatus according to claim 11 wherein said shift register means shifts consecutive samples of the NRZ data through said shift register means.

17. An apparatus for generating filtered return to zero multilevel data from binary non-return to zero (NRZ) data comprising:
 a binary finite impulse response (FIR) filter including a shift register means having a plurality of stages which receives the NRZ data, clock means for providing clock pulses to said shift register means for sampling each bit of NRZ data, a weighting element coupled to each stage for weighting each stage's output, and means for summing groups of said weighting elements to define summed signals, the number of weighting elements in each group not exceeding the number of clock pulses occurring during each bit of NRZ data;
 means for selectively inverting the polarity of each of said summed signals;
 means responsive to each NRZ data bit for controlling the polarity selection of said inverting means in accordance with said return to zero multilevel data to be generated; and
 means for summing each of said polarity selected summed signals to define said filtered return to zero multilevel data, said means for summing each of said polarity selected summed signals including a predetermined bias reference which is summed with the summed signals, said bias reference defining one state of said multilevel data.

18. The apparatus according to claim 17 wherein said multilevel data comprises three levels, and said state defined by said bias reference corresponds to the intermediate level.

19. An apparatus for generating filtered return to zero multilevel data having three or more levels from binary data comprising:
 a binary linear phase response filter for filtering the binary data, said filter sampling each bit of binary data and having an output corresponding to each sample;
 means for summing groups of said outputs wherein the number of outputs in each group does not exceed the number of times each bit of binary data is sampled by said filter, the output of each summing means defining summed signals;
 means for amplifying each of said summed signals by predetermined amplification factors;
 means responsive to each bit of binary data for controlling the selection of said amplification factor in accordance with the return to zero multilevel data to be generated, said controlling means comprising a logic means for generating a control signal in response to each bit of said binary data that determines the amplification factor to be used, said logic means permitting a change in the amplification factor of a given amplifying means only when the outputs coupled to said given amplifying means contain samples corresponding to one bit of said binary data; and
 means for summing each of said amplified summed signals to define said filtered return to zero multilevel data.

20. The apparatus according to claim 19 wherein said bit of binary data during which amplification factor changes are permitted is a logic zero.

21. A method for generating filtered return to zero multilevel data from binary data comprising the steps of:
  filtering said binary data by means of a filter having a linear phase response;
  summing the output signals from the filter in groups wherein the number of outputs in each group does not exceed the sampling rate per bit of binary data, the output of each summed group defining a summed signal;
  amplifying the summed signals with predetermined amplification factors;
  selecting the amplificaiton factor to be utilized in response to each bit of binary data in accdordance with the return to zero multilevel data to be generated and generating a control signal based upon the logic rule for encoding binary data into return to zero multilevel data; and
  summing each of the amplified summed signals to define the filtered return to zero multilevel data.

22. The method according to claim 21 further comprising the step of delaying said control signal before applying the latter to select the amplification factor associated with a given summed signal for a time duration equal to the number of outputs which precede the outputs coupled to the given summed signal divided by the number of samples per bit of binary data.

* * * * *

UNITED STATES PATENT AND TRADEMARK OFFICE
CERTIFICATE OF CORRECTION

PATENT NO.  : 4,618,941
DATED       : October 21, 1986
INVENTOR(S) : Donald L. Linder et al.

It is certified that error appears in the above-identified patent and that said Letters Patent is hereby corrected as shown below:

In Column 1, line 58, delete "nd" and substitute with --and--.

In Column 2, line 46, after "-1" insert -- in a three level data format having data levels of +1, 0, -1. --.

Signed and Sealed this

Tenth Day of March, 1987

Attest:

DONALD J. QUIGG

Attesting Officer

Commissioner of Patents and Trademarks